United States Patent [19]

Erbert

[11] Patent Number: 4,834,805

[45] Date of Patent: May 30, 1989

[54] PHOTOVOLTAIC POWER MODULES AND METHODS FOR MAKING SAME

[75] Inventor: Virgil Erbert, Tijeras, N. Mex.

[73] Assignee: Wattsun, Inc., Albuquerque, N. Mex.

[21] Appl. No.: 100,598

[22] Filed: Sep. 24, 1987

[51] Int. Cl.⁴ .................. H01L 25/02; H01L 31/18
[52] U.S. Cl. ............................ 136/246; 136/250; 136/251; 437/2
[58] Field of Search .............. 136/246, 250, 251; 437/2, 51, 205, 215, 219; 156/306.6, 306.9, 307.1, 307.3, 307.7

[56] References Cited

U.S. PATENT DOCUMENTS

| | | | |
|---|---|---|---|
| 3,370,986 | 2/1968 | Amsterdam et al. | 136/244 |
| 4,521,640 | 6/1985 | Levine | 136/250 |
| 4,638,110 | 1/1987 | Erbert | 136/246 |

Primary Examiner—Aaron Weisstuch
Attorney, Agent, or Firm—H. Michael Brucker

[57] ABSTRACT

A solar concentrator photovolataic power module of small scale wherein a plurality of pre-fabricated photovoltaic solar cells reside in a matrix array in a substrate comprised of a pair of thin sheet conductors separated by an insulator sheet. A lens sheet on which a multiplicity of lenses have been formed is disposed in a fixed spaced relation to the substrate and operates to focus radiation (sunlight) onto the photo active surfaces of the cells in order to generate electricity. The overall thickness of the module including the substrate, lens sheet and space between the two is less than two inches. The laminated substrate is formed by disposing a plurality of pre-fabricated solar cells in a matrix array onto a back conductor, overlaying onto the back conductor an insulator which surrounds each of the cells and overlaying onto the insulator a top conductor. After electrical and mechanical heat activated bonding materials are disposed between the elements of the substrate, the laminate is heated until the substrate is bonded into a single rigid module substrate.

19 Claims, 4 Drawing Sheets

PHOTOVOLTAIC POWER MODULES AND METHODS FOR MAKING SAME

BACKGROUND OF THE INVENTION

The present invention relates to photovoltaics (PV) and more specifically to concentrator photovoltaic modules and methods for making same.

The scientific community has been active in the area of photovoltaics (generation of electricity from sunlight) since the early 1960's. Initial application of this technology was directed towards uses as power sources for unmanned spacecraft. With great success in this area, the emphasis shifted to terrestrial applications. It was recognized that there was great potential in a technology that provided energy without some of the pollution drawbacks and depletion of non-renewable resources that are inherent in traditional energy generation sources.

With emphasis provided by the energy crisis of the seventies and monetary support from government sponsored programs, the pace of research and improvements in photovoltaic (PV) efficiency accelerated rapidly into the early 1980's. When the efficiency of PV reached the range of 11 to 13 percent, gains became more difficult to acquire and the associated costs of PV were becoming more apparent. By mid-1980, the cost of installed PV was still around $9.00/peak watt and of this the PV module cost was about $5.50. These figures were far above the Department of Energy (DOE) estimates of $0.50/peak watt required for PV to be competitive with existing energy sources.

The two most common methods of deploying solar cells is in a flat plate configuration, and in concentrating collector designs. The flat plate design is comprised of an assembly of solar cells arranged in a tightly packed configuration and grouped to make modules that range in sizes of one foot square to units as large as ten feet square. The flat plate collectors utilize the sun's energy on a one to one basis, meaning that all areas of the individual solar cells are exposed to an energy input equivalent of one sun radiation (minus any optical losses associated with protective cover glasses and reflection). These modules are stationary, mounted facing south, or often they are mounted on sun tracking units to increase solar input up to 30 percent. The major cost of the flat plate collector is the solar cell itself; about 55 percent of the finished module cost. Since the power output is determined by the area coverage of the cells, there are not many options to reduce the costs in this configuration except to use cheaper PV base materials. Many organizations are now investigating thin film technologies in an effort to break this price barrier.

The other approach, concentrating PV collectors, makes use of lenses or other refracting devices to focus sunlight onto specific areas of cell material to reduce the amount of expensive PV material required for a given power output. Conventionally, these concentrating collectors use large lenses (fresnel or variations thereof) to concentrate the sun's energy. The result of this is that the focal length lens is long, requiring massive support structures and, consequently, matching tracking devices. The net result is a cost that is certainly competitive with but not more cost effective that flat-plate technology.

The solution of the present invention to these immovable cost barriers is to combine the best of both technologies. The invention involves the use of small lens elements concentrating onto small solar cells. With lenses approximately one-half inch square and crystals approximately one-eighth inch square, the cost of the PV material is reduced by a factor of 15 with a module thickness of less than one inch. These two factors substantially reduce the overall costs of producing PV modules. The other non-obvious result of this approach is the compatability of producing these modules with automated production techniques. The small cells can be located and easily soldered in place with robot type equipment eliminating much of the hand assembly of current products. The combination of these factors makes the present invention capable of being produced by fully automated processes for a relatively low cost.

In addition, to breaking the cost barrier, the small size and particular arrangement of the components of the present invention results in a high efficiency electrical power source which uses concentrating collectors but does not require auxiliary cooling.

In my U.S. Pat. No. 4,638,110 for METHODS AND APPARATUS RELATING TO PHOTOVOLTAIC SEMICONDUCTOR DEVICES issued Jan. 20, 1987, I describe a photovoltaic power module characterized by an extreme reduction in scale wherein the photovoltaic crystals are formed in situ and affixed directly to a lens sheet onto which has been formed an array of micro sized miniature lenses which concentrate and direct sunlight onto the micro photovoltaic crystals. By using crystals of extremely small dimensions, the distances traveled by both migrating electrons and heat generated within the crystal are small thus eliminating the major factors responsible for limiting the power generating efficiency well known in photovoltaic devices of conventional dimensions. Because of the heat dissipating characteristics of small crystals, it is possible with my invention to employ concentrating lenses magnifying the incident radiation by 40 or 50 times without creating the necessity of employing external cooling devices.

The present invention similarly utilizes small scale components to form a photovoltaic power module including concentrating lenses which does not require auxiliary heat dissipating equipment in order to maintain an operating temperature at which the module can produce power efficiently.

In the present invention, the individual module components are of a scale larger than that taught in my previously identified patent making it possible to employ pre-fabricated cell elements which can be handled along with the other components of the module by existing automated production equipment and techniques so as to reduce the manufacturing cost. Accordingly, the present invention is capable of being produced and operated at low per watt costs making it an attractive alternative to fossil fuel power generating sources.

SUMMARY OF THE INVENTION

In the present invention small lens elements concentrate radiation (sunlight) onto small solar (PV) cells.

Each module of the present invention includes an array of pre-fabricated PV cells electrically and mechanically arranged in a matrix on a back conductor formed from a thin sheet (foil) of electrically conductive material such as copper. A layer of insulating material of approximately the same thickness as the PV cells (0.25 cm) is bonded onto the back conductor and surrounds each of the PV cells. A top conductor of a thin sheet (foil) of electrically conductive material such as copper is electrically affixed to the PV cells along their perimeters while exposing photo-active surfaces of the cells where electron flow is induced by incident radiation.

A lens sheet having a flat surface and an opposing surface onto which an array of lenses is formed in a matrix matching the matrix of the PV cells is disposed at a distance from the exposed surfaces of the PV cells such that radiation incident upon the lenses will be focused onto the exposed photo-active surfaces of the PV cells. In order to prevent the build up of dirt and debris between the cells which would greatly decrease the amount of incident radiation ultimately received by the PV cells, the flat side of the lens sheet is directed toward the source of incident radiation and the lens carrying surface of the sheet is disposed facing the PV cells: the flat surface of the lens sheet being less prone to the build up of dirt and debris and much more easily cleaned.

In order to further decrease the distance traveled by migrating electrons in the active surface of the PV cells and thus to further reduce resistance losses, the cells have a conducting grid applied to their active surface which is electrically connected to the top conductor. By the use of state of the art techniques, the grid is comprised of elements of such scale that the amount of active surface material shadowed by the grid is only approximately 5 percent.

The PV modules as described once formed can be interconnected one with the other in a variety of electrical configurations so as to produce power in a wide range of voltages and currents.

The method of the present invention for producing miniature PV modules comprises the steps of: (1) mounting a number of pre-fabricated PV cells in a grid-like matrix onto a back conductor of thin electrically conductive material; (2) providing a solder material between the PV cells and the back conductor; (3) overlaying onto the back conductor an insulator of electrically non-conductive material which includes a matrix of holes corresponding to the matrix of PV cells such that the cells are surrounded by the insulator; (4) applying a heat activated material between the back conductor and the insulator; (5) overlaying a thin top conductor of electrically conductive material onto the insulator, wherein the top conductor includes a matrix of holes which correspond to the matrix of PV cells but which holes are slightly smaller than the PV cells and thus overlay their perimeters; (6) applying a heat activated bonding material between the top conductor and the insulator; (7) providing solder material between the top conductor and the perimeters of the PV cells; (8) heating the structure to a temperature at which the bonding material is activated and the solder flows to form a laminated substrate with sound electrical connections between the PV cells and the back and top conductor sheets. The rear faces of the PV cells connected to the back conductor are electrically connected together while insulated from the opposing active surfaces of the PV cells which are themselves electrically connected together.

PRIOR ART

U.S. Pat. No. 2,777,040 to B. Kazan for LARGE AREA PHOTO CELL, issued Jan. 8, 1957 and Japanese Laid Open patent application No. 58-68988 to Igughi for BEAM-CONDENSING TYPE SOLAR CELL PANEL, issued Apr. 25, 1983 were cited during the prosecution of my above-identified patent and constitute the most pertinent prior art known to me.

The Igughi patent suggests the use of small sized lenses together with attached correspondingly small sized solar cell chips. The patent does not teach or even suggest, however, a cell support structure capable of performing the critical thermal dissipating function achieved by my invention. In fact, Igughi suggests that the individual cells be mounted in an electrically non-conducting media and interconnected by printed circuit-like conductors. Thus of necessity, Igughi suggests the use of auxiliary cooling means. Igughi fails to provide a system which is self heat regulating as is my invention and in doing so lacks a critical element necessary for successful operation.

Kazan does not teach a power generating module but rather describes a device designed for the purpose of detecting light level. Because of this difference in functional imperative, the Kazan device would not benefit from the addition of concentrating lenses and therefore Kazan makes no suggestion that concentrating lenses could be used with his device.

The invention of my previously identified patent and the invention described herein are the first photovoltaic power modules combining concentrating lenses and miniaturized scale cells in order to achieve efficient electrical generation without the bulk and expense associated with devices of traditional scale and the auxiliary cooling systems which they require.

DESCRIPTION OF PREFERRED EMBODIMENTS

Figure 1:
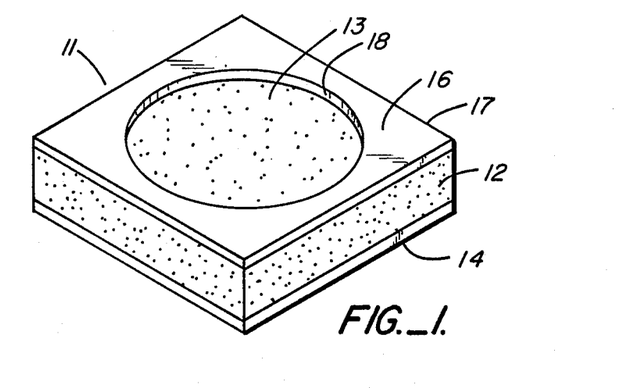
FIG. 1 is a perspective view showing a pre-fabricated PV cell used in the present invention.
Figure 2:
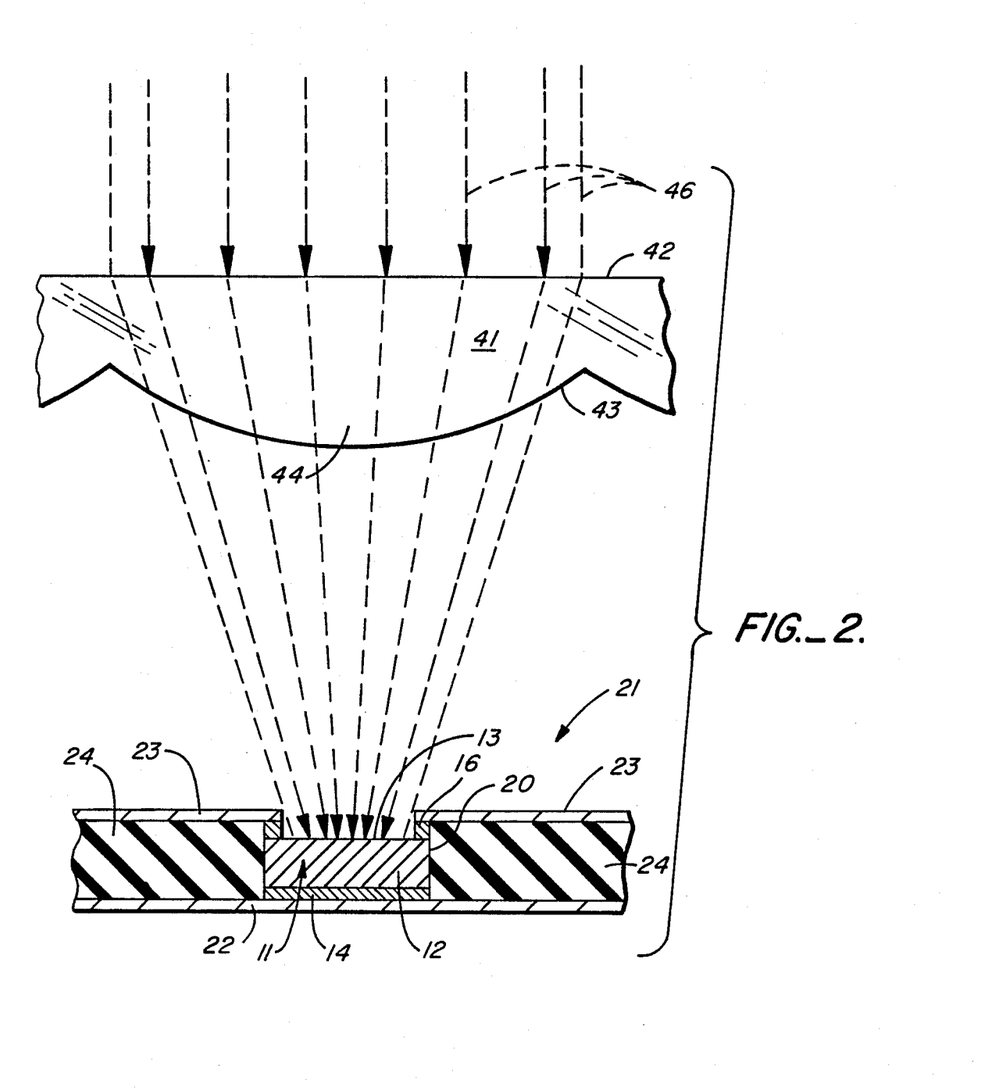
FIG. 2 is a schematic view of a portion of a module in accordance with the invention showing the relationship between a PV cell embedded in the substrate laminate and a concentrating lens.
Figures 3, 4:
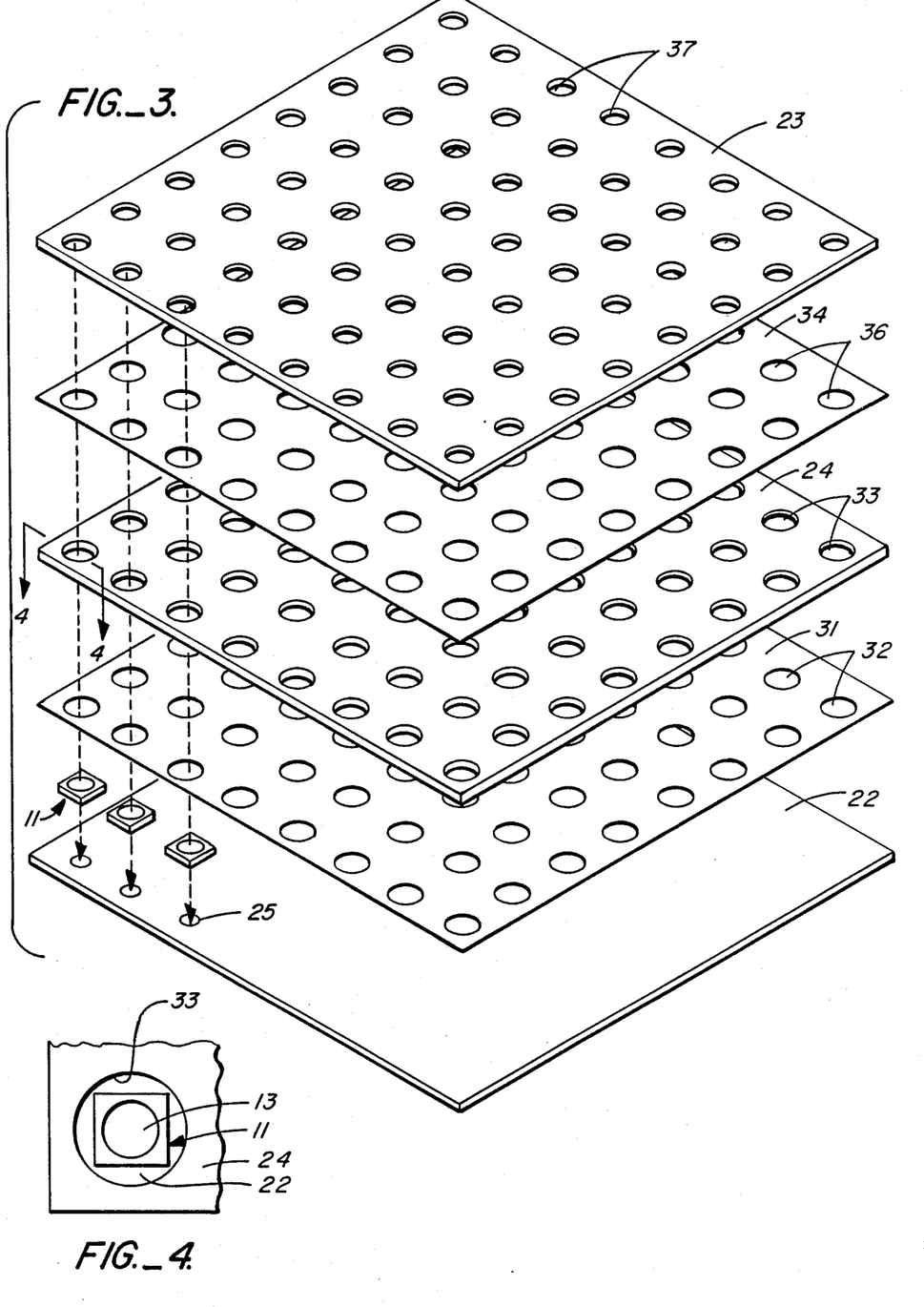
FIG. 3 is an exploded perspective view of the components of one embodiment of a substrate laminate in accordance with the invention.
FIG. 4 is a plan view taken along the line 4—4 of FIG. 3, showing the relationship between the holes in the insulator and an aligned PV cell.

Referring to FIGS. 1, 2, and 3, solar cells 11 used in the power modules 10 (FIG. 7) of the present invention are preferably pre-fabricated rectangular photovoltaic semiconductor crystal wafers 12 having a photo active top surface 13 and an obverse photo passive rear surface (not shown). Each such wafer is approximately 0.30 centimeters square and fabricated from a material, such as silicon, known to have photovoltaic properties.

Bonded both mechanically and electrically to the passive rear cell surface is a rear conductor 14 which covers the entire rear surface and more readily permits the cell to be electrically joined to the laminate substrate portion of the module. A perimeter cell conductor 16 is mechanically and electrically bonded to the photo active top surface 13 and is of a ring-shaped geometry having a rectangular outer perimeter 17 of dimensions which correspond to the dimensions of the crystal 12 and a circular inner perimeter 18 which provides a window through which radiation can pass onto the active crystal surface 13. For a crystal 0.30 centimeters square, the inner perimeter 18 of top conductor 16 is preferably 0.25 centimeters in diameter. The top perimeter conductor like the rear conductor provides a means by which the cell can be readily electrically and mechanically affixed within the module substrate.

Figure 7:
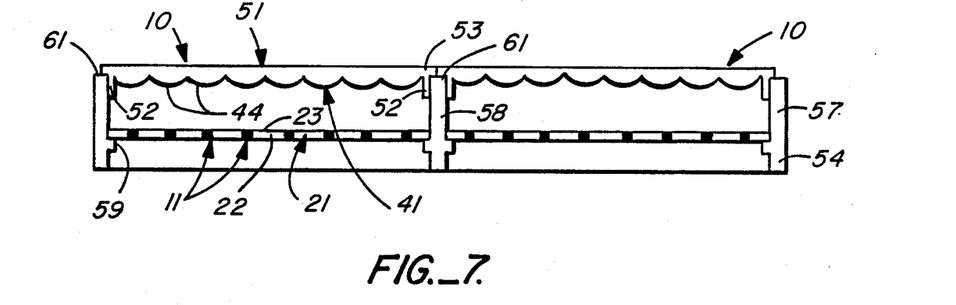
FIG. 7 is a schematic side elevation of a pair of modules in accordance with the present invention.

A power module of the present invention includes a plurality of photovoltaic (PV) cells 11 electrically and mechanically disposed in cell sites 20 formed in a laminated substrate structure 21. The substrate 21 comprises a back conductor layer 22, a top conductor layer 23 and an interposed insulator layer 24. Each PV cell 11 is mechanically and electrically affixed to the back conductor 22 at its rear conductor 14 and to the top conductor 23 at its perimeter conductor 16. Each cell is surrounded by the insulator layer 24. Thus in a power module of the present invention all of the rear (photo passive) surfaces of the PV wafers are electrically joined through their rear conductors 14 and the common back conductor 22 and in a like manner all of the top (photo active) cell surfaces 13 are electrically joined through their perimeter conductors 16 and the common top conductor 23 (FIG. 7). The insulator 24 maintains electrical separation between the back conductor 22 and top conductor 23 and thus between the active and passive surfaces of the PV crystals. Accordingly when photons are received by the active surface 13 of the PV cells, an electric potential is established between the module conductors 22 and 23 making the module an electrical power source.

For a PV wafer 0.30 centimeters square, the back conductor 22 and the top conductor 23 are advantageously formed from copper foils as thick as 5 millimeters and as thin as 1 millimeter while the insulator 24 (which for mechanical reasons needs to be essentially the same thickness as that of the pre-fabricated PV cells 11) is less than 25 millimeters thick and preferably about 20 millimeters thick. For a PV wafer less than ¼ inch square using top and back conductors less than 5 millimeters thick the cells are advantageously less than 50 millimeters thick.

Thus, the total thickness of the laminated substrate 21 can be less than 30 millimeters.

Because the dimensions of the PV cell are so small, heat generated within a cell has only a short distance to travel before reaching the surrounding conductors 14, 16, 22 and 23. These conductors are good conductors of heat as well as electricity and thus serve the dual purpose of providing an electrical circuit and an efficient means for heat dissipation. Because heat generated in conventional size PV cells exposed to concentrated sunlight cannot be dissipated quickly enough to prevent significant heat build up and a resultant efficiency loss, they require auxiliary cooling means. The diminutive size and novel arrangement of components in the present invention results in sufficient cooling by conduction and convection to permit significant radiation concentration and operation at excellent efficiencies without requiring auxiliary cooling apparatus.

While the dimensions contemplated for the present invention are small in terms of heat transfer, they are not insignificant when considering electron travel in the relatively high resistant surface 13 of the PV crystals. It is a well known technique in photovoltaics to reduce the distance that electrons must travel in a PV crystal by overlaying a conductor grid onto the cell surface.

Figure 5:
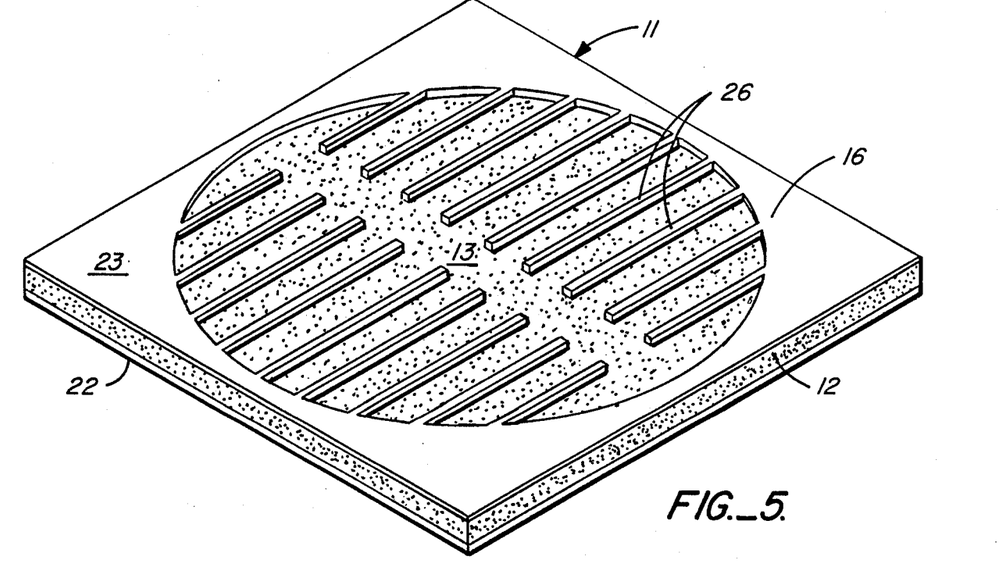
FIG. 5 is a perspective view of a pre-fabricated PV cell showing a grid overlaying the photo-active cell surface.

Referring to FIG. 5, a conductor grid 26 is overlayed onto the active surface 13 of crystal 12 (as by silkscreening, vacuum deposition, or electroplating) and electrically connected to perimeter conductor 16. When radiation induces electrons to travel in the surface 13, they can reach conductor grid 26 after traveling only a short distance in any direction and thus the $I^2R$ losses are greatly reduced. There is, of course, a reduction in received radiation due to the fact that wherever the grid 26 covers the surface 13, it casts a shadow and thereby reduces the surface area available for photovoltaic activity. The grid 26 can be formed by the methods mentioned so as to provide the desired function and cover an area of five percent or less of the otherwise exposed photo active surface 13. The efficiency gained by the presence of grid 26 is more than offsets the reduction in the PV material available for receiving radiation. It has been found that efficiency is even further enhanced by selectively doping the PV surface 13 only in the areas exposed to radiation (thus not in the areas covered by the grid 26 or the perimeter conductor 16 to which the grid is electrically connected.) Techniques for such selective doping are well known in the art and thus need not be described herein.

Referring to FIG. 3, the laminate substrate 21 including solar cells 11 is formed according to the following method. An array of cells 11 are arranged in a grid-like matrix onto back conductor 22 which is a copper foil 2-4 mils thick. The back conductor 22 can be advantageously "dimpled" (not shown) to provide discrete locations for the cells 11 and at each such location a solder dot 25 (FIG. 3) can be silkscreened onto the conductor so as to ultimately establish a good electrical connection between the rear conductor 14 of each cell and the back conductor 22. The dimples also help control solder migration during heating.

A first bonding film adhesive sheet 31 having an array of holes 32 which are large enough to surround cells 11 and which are arranged in a matrix that matches the matrix of cells 11 on conductor 22 is overlayed onto conductor 22 and surrounds each of the cells.

Insulator sheet 24 having an array of holes 33 in a matrix that matches the matrix of cells 11 is overlayed onto the first film adhesive sheet 31. Holes 33 are large enough to surround the cells 11 and do so when the holes are registered with cells 11 as best seen in FIGS. 2 and 4. A second bonding film adhesive sheet 34 having an array of holes 36 which are large enough to surround cells 11 and which are arranged in a matrix which matches the matrix of cells 11 is overlayed onto insulator sheet 24 and surrounds cells 11.

Top conductor 23 has an array of holes 37 which have a diameter equal to the diameter of the inner perimeter 18 of the perimeter conductor 16 of PV cells 11 (see FIG. 1). The matrix of holes 37 matches the matrix of cells 11 and when overlayed onto the second bonding sheet 34 and registered with cells 11 the top conductor overlays cells 11 but only at the location of the perimeter conductor 16 (see FIG. 1).

The film adhesive sheets 31 and 34 are a thermobonding plastic adhesive such as Scotch Weld Thermo Plastic Adhesive Film #4060, manufactured by 3M. The insulator sheet 24 in addition to being a good electrical insulator must be capable of withstanding soldering temperatures of 450° F. and the bonding temperatures for the adhesive films of 350° F. A material which meets these requirements is General Electric's Glass Cloth Mil-P-18177-GEE. Other suitable materials are well known and readily available.

In order to achieve good electrical connection, the top conductor can be tinned around the holes 37 and the entire back conductor surface can be tinned. Solder dots can be screened on the back conductor 22 and the top conductor can have solder printed around the holes 37.

An alternative to the bonding adhesive layers 31 and 34 is to apply a tin lead coating to both top and back conductor surfaces and to both insulator surfaces. Solder then becomes a mechanical as well as electrical binder for the substrate.

With all of the described layers properly aligned the unbonded substrate is placed into an oven where the temperature is raised to 450° F. At the temperature of 350° F. the adhesive sheets 31 and 34 (if used) flow and bond the insulator layer 24 to the back conductor 22 and the top conductor 37. At 450° F., the solder flows thereby forming electrical and mechanical connections between the rear cell conductors 14 and the back conductor layer 22 as well as between the cell perimeter conductors 16 and the top conductor layer 23. After the laminated structure is cooled, the resulting laminate 21 is unexpectedly rigid and capable of maintaining good structural integrity which is necessary for the proper and efficient operation of the module.

One of the advantages in addition to those already mentioned of using conductors constructed of thin foils is that in operation the laminate 21 will experience significant temperature cycling between a high temperature (when there is abundant sun energy) and low temperature (during the night). Such temperature cycling is normally a problem which manifests itself in fatiguing electrical connections. Because the electrical connections of the present invention are made of thin foil conductors which are inherently flexible, the stresses on the electrical connections are greatly minimized.

The resultant laminated substrate 21 electrically connects all of the cells 11 in the manner described above without the requirement of any individual wires thus giving the laminate the kind of electrical integrity found in printed circuit boards.

Each module of the present invention thus presents an array of exposed PV cell surfaces 13 which when irradiated with sunlight will generate an electrical current. In order to make the most efficient us of each cell surface 13, a concentrating lens sheet 41 is provided to receive the sunlight, concentrate it and focus it onto a cell surface 13 (see FIGS. 2 and 7).

Figures 6A, 6B:
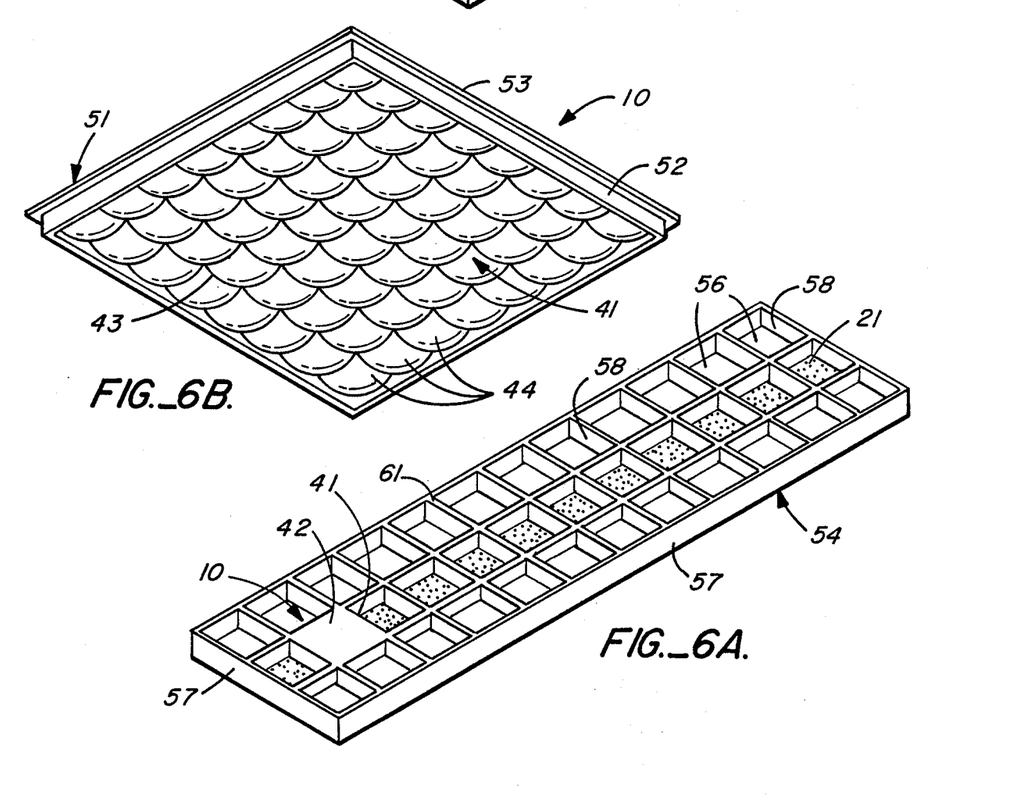
FIG. 6A is a are perspective view of a module housing into which a multiplicity of modules can be combined.
FIG. 6B is an enlarged perspective view of the lens side of lens sheet designed to fit into the housing of FIG. 6A.

Referring to FIGS. 2, 6 and 7, a lens sheet 41 has a flat side 42 and an opposing lens side 43 onto which a matrix of square lenses 44 are formed (if plastic the lenses can be embossed). The lenses 44 are aspherical and designed to have a short focal length compared to a physical lens so as to minimize the distance between the lens sheet 41 and the laminated structure 21. They are also designed to focus the irradiation (light rays) 46 onto cell surface 13 in a generally uniform distribution, once again as compared to a spherical lens. The lens sheet 41 is disposed that distance from laminate structure 21 which focuses incident radiation 46 into a circle of light onto cell surface 13 which circle of light is of a diameter slightly less than the diameter of the exposed active crystal surface 13 so that slight errors in sun tracking will not result in some of the radiation being focused onto non-productive surfaces. Since the focusing capabilities of lenses 44 is independent of whether the flat surface 42 or the lens surface 44 is facing the laminated structure 21, it is advantageous to have the flat surface 42 become the outer surface of the module since dirt and debris is less likely to adhere to and collect on the flat surface 42 than it would be on the opposing lens surface where the depressions between lenses are a natural collecting areas for light obscuring materials. Cleaning the surface 42 is also more easily accomplished than cleaning the lens surface.

The lenses 44 formed on lens sheet 41 are selected of a design to have a minimum amount of internal reflection so as to minimize light loss through the lens.

Referring to FIGS. 6A, 6B, and 7, a lens sheet 41 is molded to include a rectangular lens holder 51 which includes depending side walls 52 and extending flanges 53. An ice-cube tray like housing 54 having a plurality of module pockets 56 is designed to receive a plurality of module substrates 21 and lens sheets 41 and position the lens sheets at the correct distance from the active cell surfaces to produce the image desired. Housing 54 has a perimeter wall 57 and internal pocket forming walls 58. A ledge 59 is formed within each pocket 56 and supports a substrate 21 at a pre-selected distance from the top edge 61 of the housing walls 57 and 58. The dimensions of lens holder 51 is such that it fits snuggly into a pocket 56 of housing 54 with lens holder side walls 52 fitting inside pockets 56 and lens holder flanges 53 resting on top of edge 61 of the pocket forming members. The lenses are thus automatically disposed a fixed distance from the substrate and registered with the cells therein whereby light focused by the lenses is directed to the active cell surfaces in a circle slightly smaller in diameter than the diameter of the active cell surface 13. By the use of well known materials and sealing techniques, the modules in housing 54 are protected against dirt and moisture while the flat surfaces of the lens sheets can be easily cleaned to assure maximum light transmission. The multi module unit can be readily affixed to a sun tracking system (not shown).

The housing 54 as well as the lenses and lens frames can be advantageously be molded of plexiglass.

The combined thickness of the module 10 including the laminated substrate 21, the lens sheet 41, the space therebetween, and the housing 54 is less than one inch.

Using materials well known for their photovoltaic characteristics, each cell is capable of establishing 0.6 volts. In order to be able to deliver electrical power in a variety of voltages and currents, the individual modules are capable of being interconnected in series or parallels.

Figure 8:
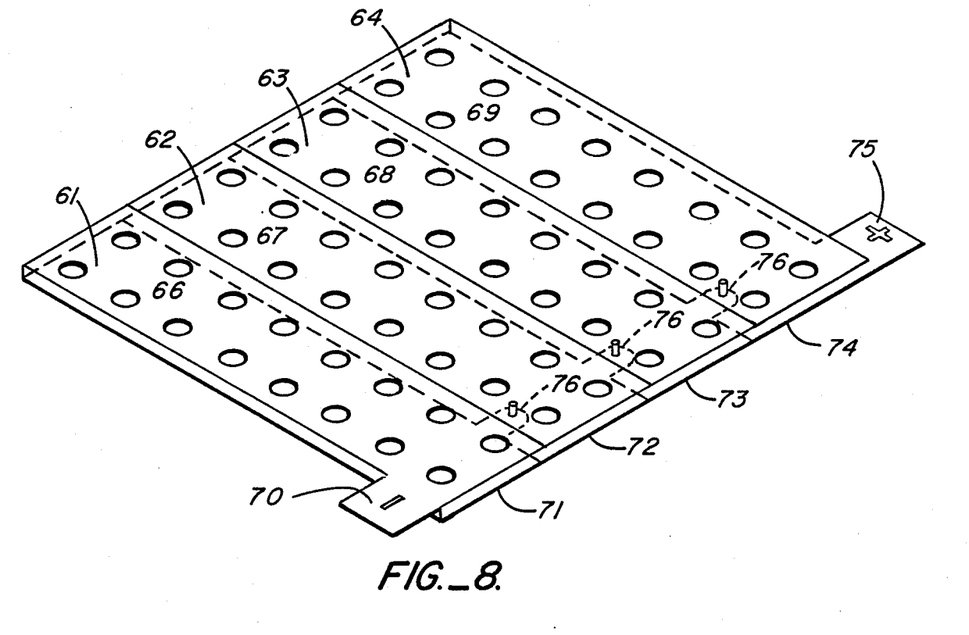
FIG. 8 is a perspective view of a number of module substrates according to the invention showing how they can be electrically interconnected.

Module interconnection either in series or in parallel can be achieved as illustrated in FIG. 8. Four separate modules (or a single module etched into four parts) 61, 62, 63 and 64 (shown without accompanying lens sheets) each have a top conductor 66, 67, 68 and 69, respectively, which are arbitrarily designated as a negative polarity with end module 61 having a terminal tab 70 which is the negative terminal of the combined modules. Each module has a back conductor 71, 72 73 and 74, respectively, which are separated from the top conductors by insulators as previously described and which are designated as positive. Each of the conductors are made separate from each other as are the back conductors either by etching a space therebetween or inserting an insulator between each. The back conductor 74 of module 64 has a terminal tab 75 which represents the positive terminal. Each module includes an interconnect tab 76 integral with its associated back conductor and which overlaps into the area of the back conductor of the adjacent module when the modules are aligned. The area of overlap of tab-76 is devoid of back conductor material and the back conductors and top conductors of the individual modules are separated from one another when the modules are aligned as shown. Thus, the tabs 76 do not make electrical contact with the adjacent back conductor unless an electrical connection between the two is formed. In order to place the individual modules in electrical parallel configuration, adjacent top conductors and adjacent bottom conductors are electrically joined. To put the adjacent modules in electrical series configuration, however, the bottom conductor of one module is electrically joined to the top conductor of the adjacent module. This is achieved by connecting the tab 76 through an electrical feed through connector 77.

By a combination of series or parallel configurations, the modules of the present invention can be combined to tailor the output to match a wide variety of requirements.

I have specified a number of dimensions and products in describing the preferred embodiment of my invention, but in doing so for illustrative purposes it was not intended to restrict the invention to those particulars. While I cannot state with precision at what point the scale of the modules loses the advantages of small scale, I do know that even for modules double the size described herein, advantages are realized making such devices worth building. In fact a number of modifications to the embodiments described readily suggest themselves but do not depart from the invention which is limited only by the following claims.

What is claimed is:

1. A photovoltaic power module comprising in combination:
   an array of photovoltaic semiconductor crystal cells disposed in individual cell sites formed in a laminated substrate comprised of two electrically conductive sheets separated by an insulating sheet;
   a light transmissive lens sheet having an array of lenses formed therein disposed at a distance from and relative to said laminated substrate whereby radiation incident on the lenses of said lens sheet is focused onto said photovoltaic cells in said substrate;
   wherein the combined thickness of the lens sheet, laminated substrate and space therebetween is less than 2 inches.

2. The invention of claim 1 wherein the lenses of said lens sheet are aspherical to project a generally uniform distribution of radiation over the surface of the cell and to have a short focal length as compared to a spherical lens.

3. The invention of claim 1 wherein each photovoltaic crystal cell comprises
   a wafer of photovoltaic crystal material having two opposing face surfaces;
   a rear conductor of electrically conductive material electrically and mechanically affixed to one face of said wafer;
   a ring-shaped perimeter conductor of electrically conductive material electrically and mechanically applied to the other face of said wafer wherein wafer material within the inner perimeter of said perimeter conductor is exposed; and
   wherein said cells ar disposed in said cell sites such that the exposed wafer material faces and is exposed to said lens sheet.

4. The invention of claim 3 wherein said rear conductor is electrically connected to one of said sheet and said perimeter conductor is electrically connected to the other sheet conductor.

5. The invention of claim 4 wherein said wafer is generally rectangular; said rear conductor covers the entire surface to which it is affixed; said perimeter conductor has an outer perimeter which is rectangular and generally matches the perimeter of the wafer face to which is is affixed and an inner perimeter which is generally circular and which encloses an area equal to at least 80 percent of the area of the face of the wafer to which the perimeter conductor is affixed.

6. The invention of any one of claims 1-5 wherein said lens sheet has one substantially flat side and one side in which a matrix of a multiplicity of concentrating lenses is formed and said lenses face said laminated substrate.

7. The invention of claim 3 wherein the surface of the wafer material within the inner perimeter conductor has disposed thereon and in electrical contact therewith a grid of very thin electrical conductors which are electrically connected to said perimeter conductor.

8. The invention of claim 7 wherein the total surface area of said grid is less than ten percent of the entire surface area of crystal material within the inner perimeter of said perimeter conductor.

9. The invention of claim 7 wherein said cell crystal surface within the inner perimeter of said perimeter conductor is selectively doped in the areas not covered by said grid.

10. A photovoltaic power module comprising in combination:
    a thin back conductor sheet of electrically conductive material;
    an array of photovoltaic semiconductor crystal cells attached both mechanically and electrically in a spaced array onto said back conductor;
    an insulator sheet of electrically insulating material substantially the same thickness as said cells and having an array of holes which are larger than said cells and arranged in a matrix which matches the matrix of cells on said back conductor, said insulator sheet overlayed and affixed to said back conductor such that each cell on said back conductor is within a hole of said insulator sheet;
    a thin top conductor sheet of electrically conductive material having an array of holes in a matrix which matches the matrix of cells on said back conductor, said top conductor overlayed and affixed to said insulator such that a small perimeter area of each cell is also overlayed by said top conductor which is electrically connected to said cell at such perimeter overlay;
    a thin lens sheet having a array of concentrating lenses arranged in a matrix which matches the matrix of cells on said back conductor, said lens sheet affixed at a spaced distance from said top conductor whereby radiation on said lenses is concentrated and directed to said lens;

wherein the combined thickness of said back conductor, said insulator, said top conductor, said lens sheet and the space between said top conductor and said lens sheet is less than two inches.

11. The invention of claim 10 wherein said lens sheet has a flat surface and a surface in which lenses are formed and wherein the surface in which the lenses is formed faces said cells.

12. The invention of claim 10 wherein each cell includes a rear conductor which is electrically and mechanically affixed to said back conductor sheet and a perimeter conductor which is mechanically and electrically connected to said top conductor sheet.

13. The invention of claim 12 wherein said back conductor and top conductor are each formed from a separate copper sheet less than 5 millimeters thick and said insulator is less than 25 millimeters thick.

14. The invention of claim 10 wherein the lenses of said lens sheet are aspherical and project a more uniform distribution of radiation over the surface of the cells, and have a shorter focal length than a spherical lens.

15. A method of making a very thin photovoltaic (PV) module substrate comprising the steps of:

locating a plurality of PV cells in a matrix array on a back conductor of electrically conductive material;

overlaying an insulator of electrically non-conductive material having a matrix of holes matching the matrix of cells onto the back conductor whereby each of the cells is disposed in an insulator hole and is surrounded by insulator material;

overlaying onto the insulator a top conductor of electrically conductive material having an array of holes in a matrix corresponding to the matrix of cells wherein the holes are smaller than the cells whereby the perimeters of the cells are overlayed by the top conductor;

disposing heat activated bonding material between the top conductor and the insulator and between the back conductor and the insulator;

disposing heat activated electrical bonding material between each cell and the top and back conductor; and heating the formed substrate at a temperature and for a duration which activates the bonding materials and forms a unified rigid substrate wherein the top conductor and the cells and the back conductor and cells are electrically contacted;

wherein the combined thickness of the substrate is less than one inch.

16. The method of claim 15 wherein the PV cells are each less than one quarter inch square and less than 50 millimeters thick;

the insulator is approximately the same thickness as the PV cells; and the top and back conductors are each less than 5 millimeters thick.

17. The method of claim 15 wherein all of the bonding material is solder.

18. The method of claim 15 wherein the bonding material between the insulator and top and bottom conductors is in the form of a sheet having holes in a matrix corresponding to the cell matrix.

19. A photovoltaic modules substrate made in accordance with the method of any one of claims 15–18.

* * * * *